United States Patent
Lee

(10) Patent No.: US 6,842,343 B2
(45) Date of Patent: Jan. 11, 2005

(54) DEVICE FOR ANCHORING COMPONENTS ON CIRCUIT BOARD

(76) Inventor: Kuoshao Lee, 3F, No. 82, Sec. 2, Jungshen Street, Wenshan Chiu, Taipei (TW), 116

( * ) Notice: Subject to any disclaimer, the term of this patent is extended or adjusted under 35 U.S.C. 154(b) by 29 days.

(21) Appl. No.: 10/305,876

(22) Filed: Nov. 27, 2002

(65) Prior Publication Data
US 2004/0100777 A1 May 27, 2004

(51) Int. Cl.[7] .............................. H05K 7/00; H05K 5/00; H05K 5/04; H05K 5/06
(52) U.S. Cl. ...................... 361/747; 361/740; 361/732; 361/759; 361/801
(58) Field of Search ................................ 361/728, 732, 361/736, 740, 741, 742, 747, 748, 756, 758, 759, 770, 801, 802

(56) References Cited

U.S. PATENT DOCUMENTS

| | | | | |
|---|---|---|---|---|
| 4,318,157 A | * | 3/1982 | Rank et al. | 361/704 |
| 4,373,309 A | * | 2/1983 | Lutz | 52/182 |
| 4,760,495 A | * | 7/1988 | Till | 361/804 |
| 4,873,394 A | * | 10/1989 | Bhargava et al. | 174/35 R |
| 5,535,100 A | * | 7/1996 | Lubahn et al. | 361/801 |
| 5,671,124 A | * | 9/1997 | Ho | 361/758 |
| 5,962,133 A | | 10/1999 | Yamaguchi et al. | 428/403 |
| 5,978,232 A | * | 11/1999 | Jo | 361/796 |
| 6,236,574 B1 | * | 5/2001 | Han | 361/816 |
| 6,333,855 B2 | * | 12/2001 | Prabaonnaud et al. | 361/758 |
| 6,456,506 B1 | * | 9/2002 | Lin | 361/816 |
| 6,560,119 B1 | * | 5/2003 | Katsuyama et al. | 361/752 |

* cited by examiner

*Primary Examiner*—Phuong T. Vu

(57) ABSTRACT

A circuit board device includes one or more slots formed in a board, and one or more fastener members having one or more projections engageable into the slots of the board, to anchor the fastener member to the board, and to prevent the fastener member from moving relative to the board while welding the fastener member to the board with one or more solders. One or more electronic components may then be precisely and easily aligned with and secured to the fastener members with the other fastener members. A solder member may be applied on the board for securing to the solders.

5 Claims, 3 Drawing Sheets

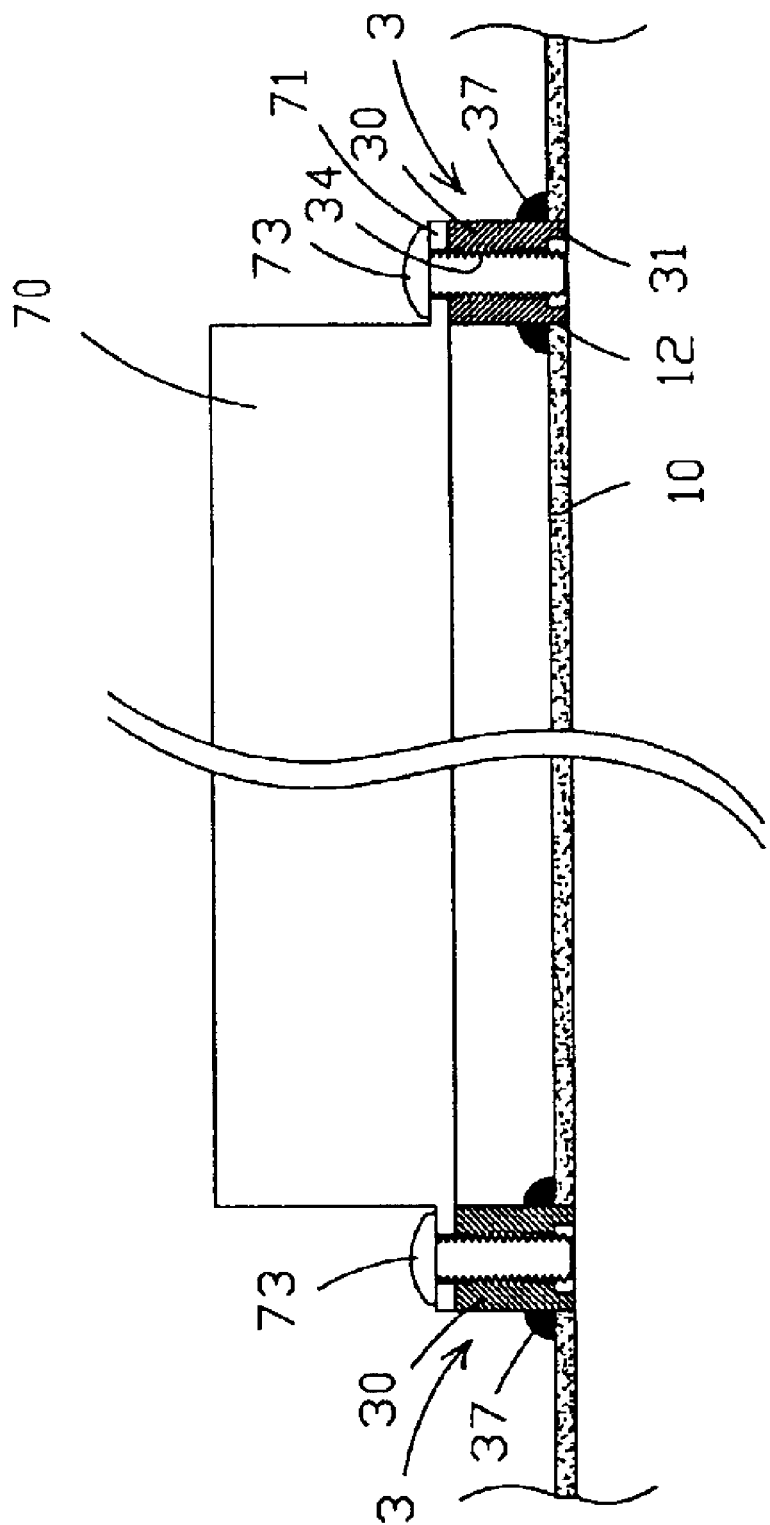

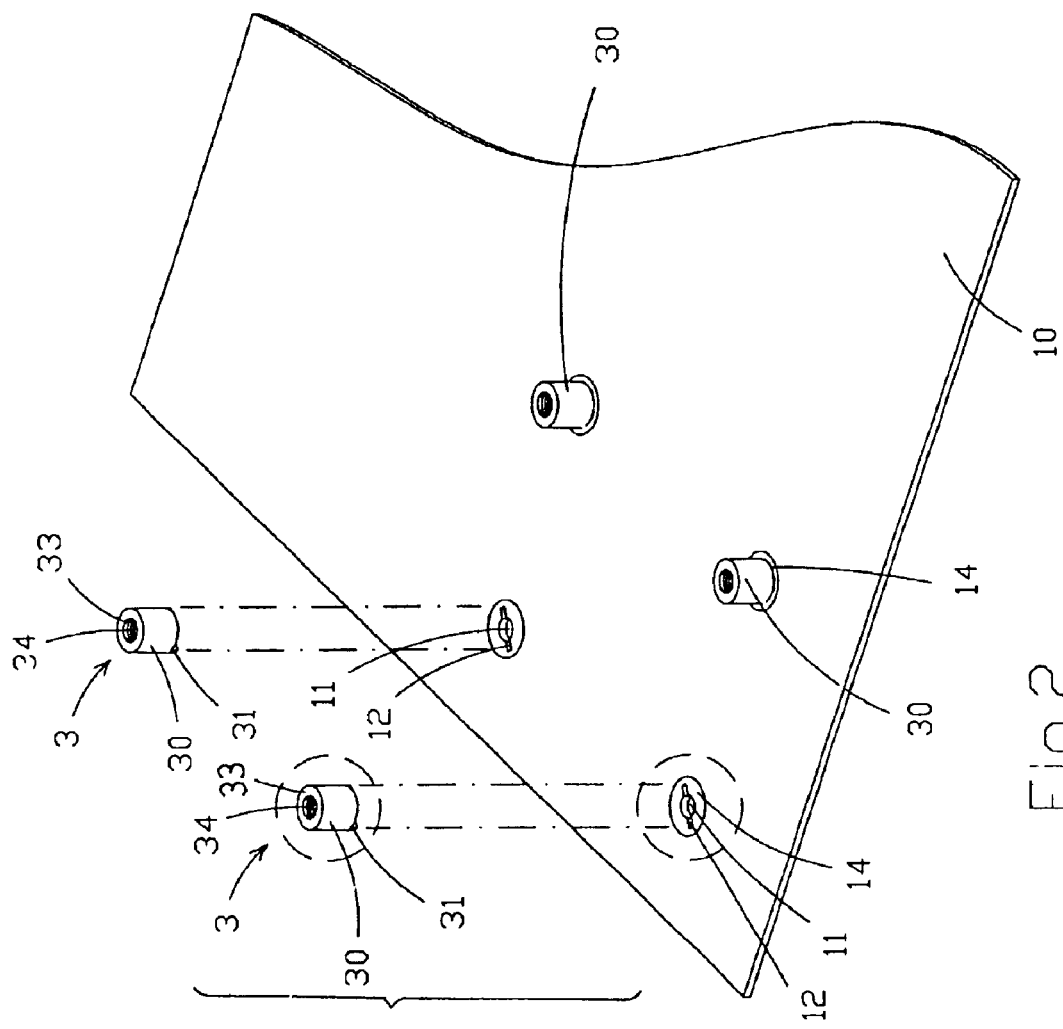
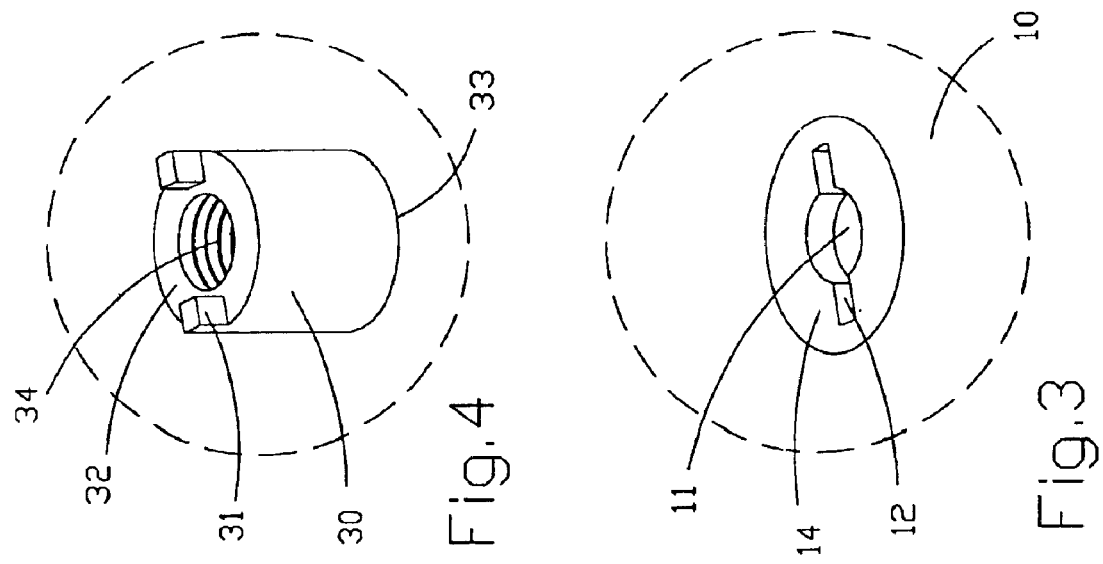

DEVICE FOR ANCHORING COMPONENTS ON CIRCUIT BOARD

BACKGROUND OF THE INVENTION

1. Field of the Invention

The present invention relates to a circuit board, and more particularly to a device for solidly and stably anchoring and securing electronic parts or components onto the circuit board.

2. Description of the Prior Art

Typical computer facilities comprise one or more electronic circuit boards each having a number of parts or components secured thereto with fasteners, solders, latches, or the like.

For example, the resistors, the capacitors, the processor units, the disk drivers, such as the hard disk drivers, etc., are required to be secured onto the electronic circuit board, by such as the screw threaded fasteners, the soldering operations etc.

U.S. Pat. No. 5,962,133 to Yamaguchi et al. discloses one of the typical electronic circuit boards including a number of electronic components secured to the electronic circuit board with solders (solder pastes) and electrodes (lands).

However, while soldering or welding the electronic components onto the electronic circuit board with the solders and/or electrodes, it will be difficult to positively retain or position the electronic components relative to the electronic circuit board, such that the electronic components may normally be offset from the predetermined position on the electronic circuit board.

The present invention has arisen to mitigate and/or obviate the afore-described disadvantages of the conventional electronic circuit boards.

SUMMARY OF THE INVENTION

The primary objective of the present invention is to provide an electronic circuit board assembly including an anchoring device for solidly and stably anchoring and securing electronic parts or components onto the circuit board, and thus for positively retaining or positioning the electronic components to the electronic circuit board.

The other objective of the present invention is to provide a method for solidly and stably anchoring and securing electronic parts or components onto the circuit board, and thus for positively retaining or positioning the electronic components to the electronic circuit board.

In accordance with one aspect of the invention, there is provided a circuit board assembly comprising a board body including at least one slot formed therein, at least one first fastener member including at least one projection extended therefrom and engageable into the slot of the board body, to anchor the first fastener member to the board body, and to prevent the first fastener member from moving relatively to the board body, at least one solder secured between the board body and the first fastener member for securing the first fastener member to the board body, a component supported on the first fastener member, and a second fastener member engaged with the first fastener member for securing the component to the first fastener member and thus the board body with the second fastener member. The first fastener member may be precisely anchored to the board body and will not be moved or rotated relatively to the board body while soldering the first fastener member to the board body, for allowing the component to be easily and quickly and precisely aligned with the first fastener member and to be secured to the first fastener member with the second fastener member.

The slot of the board body includes a non-circular cross section, the projection of the first fastener member includes a non-circular cross section corresponding to that of the slot of the board body for engaging into the slot of the board body.

The first fastener member includes an inner thread formed therein, the second fastener member is a screw fastener for threading with the inner thread of the first fastener member.

The board body may further include an orifice formed therein for receiving the screw fastener, and for further anchoring or positioning the first fastener member to the board body.

The board body includes a solder member provided around the slot of the board body, and welded to the solder.

The board body includes at least one second slot formed therein and spaced away from the slot thereof, the first fastener member includes at least one second projection extended therefrom and spaced away from the projection, for engaging into the second slot of the board body, and for further anchoring the first fastener to the board body, and for further preventing the first fastener from rotating relatively to the board body.

Further objectives and advantages of the present invention will become apparent from a careful reading of a detailed description provided hereinbelow, with appropriate reference to accompanying drawings.

BRIEF DESCRIPTION OF THE DRAWINGS

FIG. 1 is a partial cross sectional view illustrating an attachment of electronic components onto an electronic circuit board assembly in accordance with the present invention;

FIG. 2 is a partial exploded view of the electronic circuit board;

FIG. 3 is an enlarged partial perspective view of the electronic circuit board;

FIG. 4 is an enlarged perspective view illustrating a fastener to be secured onto the electronic circuit board;

DETAILED DESCRIPTION OF THE PREFERRED EMBODIMENT

Figure 6:
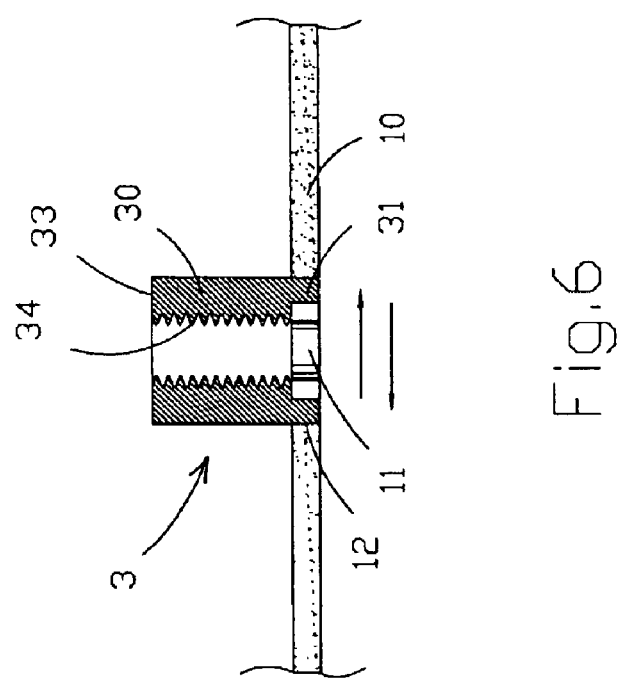
FIG. 6 is a cross sectional view taken along lines 6—6 of FIG. 5.

Referring to the drawings, and initially to FIG. 1, an electronic circuit board assembly in accordance with the present invention comprises a circuit board body 10, and one or more electronic components 70, such as the resistors, the capacitors, the processor units, the disk drivers, or the hard disk drivers, etc., to be secured to the circuit board body 10 with one or more fastener devices 3.

The fastener devices 3 each includes a first fastener member 30, such as a nut member 30, to be secured onto the circuit board body 10, and a second fastener member 73, such as a screw fastener 73 to be threaded to the nut member 30, for securing the electronic components 70 to the circuit board body 10. The first fastener member 30 has a cylindrical body and at least one pair of downward projections 31 formed in one line at one end of the first fastener member 30.

Referring next to FIGS. 2–6, the circuit board body 10 includes one or more orifices 11 and one or more slots 12 formed therein. The orifices 11 and the slots 12 of the circuit board body 10 may be communicated with each other or not communicated with each other.

The circuit board body 10 may selectively or optionally provide an electrode or a solder, such as a solder paste or solder layer or solder member 14 applied on one or both surfaces thereof and provided around the orifices 11 and the slots 12 thereof.

The first fastener member or the nut member 30 of the fastener device 3 includes one or more projections 31 extended therefrom, such as extended from one end 32 thereof, for engaging into the slots 12 of the circuit board body 10, and thus for anchoring or securing or positioning the first fastener member 30 to the circuit board body 10.

It is preferable that the fastener member 30 includes one or more pairs of opposite projections 31 extended therefrom, for solidly securing or positioning the fastener member 30 to the circuit board body 10, and for preventing the fastener member 30 from moving or rotating relatively to the circuit board body 10.

Figure 5:
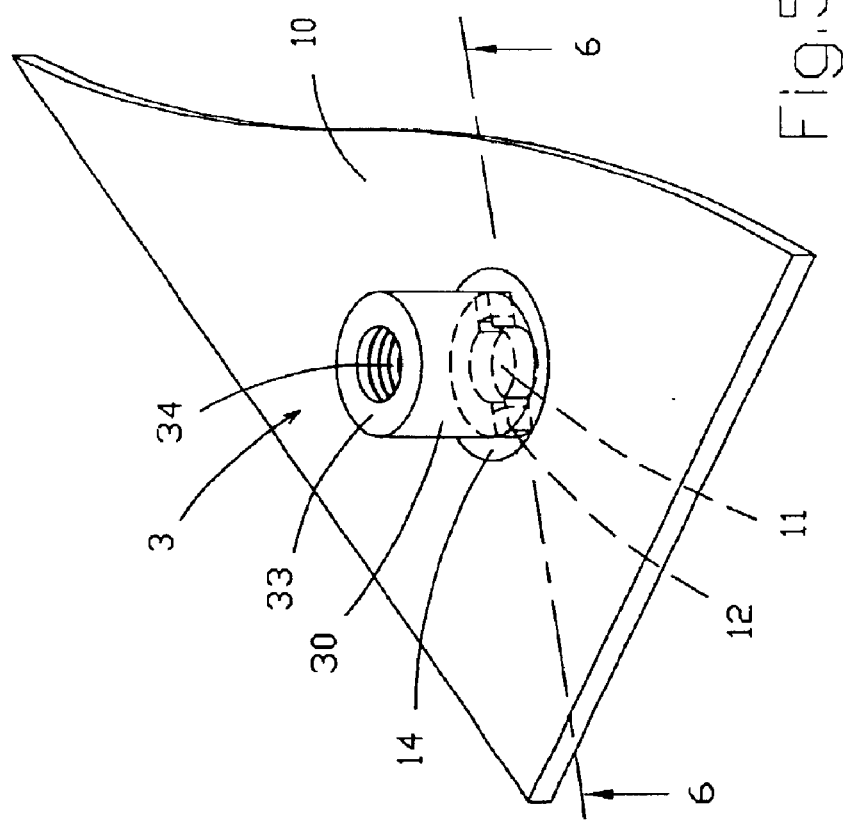
FIG. 5 is an enlarged partial perspective view of the electronic circuit board, having the fastener secured thereon.

For example, as shown in FIGS. 4–6, the fastener member 30 includes a pair of opposite projections 31 extended therefrom and aligned with each other in one line, and spaced away from each other, far engaging into the corresponding slots 12 of the board body 10, and thus for preventing the fastener member 30 from moving or rotating relatively to the board body 10. As shown in FIG. 3, preferably a pair of slots 12 are formed as extension of the orifice and aligned in one line to match the pair of opposite projections 31.

When the fastener member 30 includes two pairs of projections 31 extended therefrom, it is preferable that the two pairs of projections 31 are arranged in a cross shape for engaging into the corresponding slots 12 of the circuit board body 10, and thus for preventing the fastener member 30 from moving or rotating relatively to the circuit board body 10.

Similarly, when the fastener member 30 includes three or more pairs of projections 31 extended therefrom, the projections 31 may be arranged in a circle or extended from the outer peripheral portion of the fastener member 30, for engaging into the corresponding slots 12 of the circuit board body 10, and thus for preventing the fastener member 30 from moving or rotating relatively to the circuit board body 10.

The shape and the length and/or the width and/or the area of the projection 31 may preferably be arranged to be equal to or slightly greater than that of the slots 12 of the circuit board body 10, for allowing the projections 31 to be snugly fitted into the corresponding slots 12 of the circuit board body 10.

For example, the projection 31 and the slots 12 of the circuit board body 10 preferably include a corresponding non-circular cross section, for allowing the projections 31 to be snugly mated and fitted into the corresponding slots 12 of the circuit board body 10, and for preventing the fastener member 30 from rotating relatively to the circuit board body 10 when only one projection 31 is engaged into one of the slots 12 of the circuit board body 10.

The other end 33 of the fastener member 30 is provided for seating or supporting the electronic components 70 (FIG. 1), and for allowing the electronic components 70 to be separated and spaced away from the circuit board body 10 by the fastener members 30. The fastener members 30 each includes a screw hole or an inner thread 34 formed and provided therein for threading with the screw fastener 73.

In operation, as shown in FIG. 1, the projections 31 of the fastener members 30 may first be engaged into the corresponding slots 12 of the circuit board body 10. The fastener members 30 may then be welded or soldered to the circuit board body 10 with one or more solders 37 which may be secured or welded to the solder members 14.

The electronic components 70 each includes one or more ears 71 laterally extended therefrom and engaged or seated or supported on the respective fastener members 30, and secured to the fastener members 30 with the other fastener members 73, for allowing the electronic components 70 to be easily and solidly secured onto the circuit board body 10 by the fastener members 30, 73.

It is to be noted that the fastener members 30 may be positively positioned and secured to the circuit board body 10 at the predetermined or required position by engaging the projections 31 of the fastener members 30 into the corresponding slots 12 of the circuit board body 10, such that the fastener members 30 will not be moved or disengaged relatively to the circuit board body 10 while welding or soldering the fasteners 30 to the circuit board body 10.

In addition, after the fastener members 30 have been positively positioned and secured to the circuit board body 10 at the predetermined or required position, the ears 71 of the electronic components 70 may be easily and precisely aligned with the respective fastener members 30, for allowing the fastener members 73 to be easily engaged through the ears 71 of the electronic components 70 and threaded or secured to the fastener members 30.

It is further to be noted that the orifices 11 may be optionally or selectively formed or provided in the circuit board body 10, for selectively or optionally receiving the fastener member 73 (FIG. 1), and preferably for snugly receiving the fastener member 73, and thus for further solidly securing or positioning the fastener member 73 to the circuit board body 10.

Alternatively, the fastener member 73 may include one or more corresponding projections extended therefrom and engaged through the corresponding slots 12 of the board body 10, and the fastener member 73 may be engaged through the ears 71 of the electronic component 70 and threaded to the other fastener member 30, for securing the electronic component 70 to the board body 10.

Accordingly, the electronic circuit board assembly in accordance with the present invention includes an anchoring device for solidly and stably anchoring and securing electronic parts or components onto the circuit board, and thus for positively retaining or positioning the electronic components to the electronic circuit board.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A circuit board assembly comprising:
   at least one first fastener member having a cylindrical body and at least one pair of downward projections formed in one line at one end of said first fastener member;
   a board body being formed with at least one orifice and at least one pair of slots extended and protruded from said orifice, said at least one pair of slots being substantially matched with said downward projections in shape and formed in one line for receiving said at least one pair of downward projections;

a component supported by said at least one first fastener member above said board body; and at least one second fastener member securely fastening said component onto said at least one first fastener member.

2. The circuit board assembly as claimed in claim 1, wherein each projection of said at least one pair of projections has a non-circular cross section and each slot of said at least one pair of slots has a corresponding non-circular cross section for tightly engaging said at least one pair of projections with said at least one pair of slots.

3. The circuit board assembly as claimed in claim 1, wherein said at least one first fastener member has an inner thread formed therein and said at least one second fastener member is a screw fastener for threading with said inner thread.

4. The circuit board assembly as claimed in claim 1, further comprising at least one solder secured between said board body and said at least one first fastener member for securing said at least one first fastener member to said board body.

5. The circuit board assembly as claimed in claim 4, wherein said board body includes a solder member provided around said at least one pair of slots and welded to said at least one solder.

* * * * *